(12) United States Patent
Karabacak et al.

(10) Patent No.: US 7,244,670 B2
(45) Date of Patent: Jul. 17, 2007

(54) ENHANCED STEP COVERAGE OF THIN FILMS ON PATTERNED SUBSTRATES BY OBLIQUE ANGLE PVD

(75) Inventors: Tansel Karabacak, Troy, NY (US); Toh-Ming Lu, Loudonville, NY (US); John Robert Barthel, East Nassau, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 205 days.

(21) Appl. No.: 10/872,083

(22) Filed: Jun. 18, 2004

(65) Prior Publication Data
US 2005/0282369 A1 Dec. 22, 2005

(51) Int. Cl.
*H01L 21/20* (2006.01)
*H01L 21/31* (2006.01)
*C23C 14/00* (2006.01)

(52) U.S. Cl. ............... 438/584; 438/758; 257/E21.536; 204/192.17

(58) Field of Classification Search ........... 204/192.17; 438/584, 758
See application file for complete search history.

(56) References Cited

U.S. PATENT DOCUMENTS

| | | | |
|---|---|---|---|
| 4,944,961 A | | 7/1990 | Lu et al. |
| 5,290,358 A | * | 3/1994 | Rubloff et al. .............. 118/715 |
| 5,885,425 A | * | 3/1999 | Hsieh et al. ............ 204/192.12 |
| 6,206,065 B1 | | 3/2001 | Robbie et al. |
| 6,429,105 B1 | | 8/2002 | Kunikiyo |
| 6,716,322 B1 | | 4/2004 | Hedge et al. |

OTHER PUBLICATIONS

C.H. Choi et al., "Epitaxial grown of Al(111)/(Si(111) films using partially ionized beam deposition," 1992 Appl. Phys. Lett. 51 (24), Dec. 14, 1987 American Inst. of Physics., pp. 1992-1994.
B. Gittleman, et al., "Impurity effects in partially ionized beam metal via filling," J. Vac. Sci. Technol. A 8 (3), May/Jun. 1990 American Vacuum Society, pp. 1514-1520.
T. Karabacak et al., "Growth-frint roughening in amorphous silicon films by sputtering," Physical Review B. vol. 64, The American Physical Society, pp. 085323-1-085323-6.
S.M. Rossnagel, "Sputter deposition for semiconductor manufacturing," IBM J. Res. Develop. vol. 43, No. ½ Jan./Mar. 1999 IBM., pp. 163-179.
S.M. Rossnagel, "Directional and ionized physical vapor deposition for microelectronics applications," J. Vac. Sci. Technol. B 16(5), Sep./Oct. 1998 Am. Vacuum Soc., pp. 2585-2608.
John A. Thornton, "The microstructure of sputter-deposited coatings," J.Vac.Sci.Technol. A 4(6), Nov./Dec. 1986 American Vacuum Society, pp. 3059-3056.
John A. Thornton, "Structure-Zone Models of Thin Films," SPIE vol. 821 Modeling of Optical Thin Films (1987), pp. 95-103.

* cited by examiner

*Primary Examiner*—Scott B. Geyer
(74) *Attorney, Agent, or Firm*—Wolf Greenfield & Sacks

(57) ABSTRACT

A method and an apparatus for fabricating an integrated circuit entail directing a vapor flux toward a substrate surface from a plurality of directions associated with a plurality of azimuth angles, and selecting a deposition angle of the vapor flux, relative to a normal incidence, to obtain a substantially conformal film. The surface feature can be associated with, for example, one or more vias and/or one or more trenches.

21 Claims, 6 Drawing Sheets

ENHANCED STEP COVERAGE OF THIN FILMS ON PATTERNED SUBSTRATES BY OBLIQUE ANGLE PVD

This invention was made with government support under Grant Number 021587 awarded by NSF. The government has certain rights in the invention.

BACKGROUND OF INVENTION

1. Field of Invention

The invention is related to methods and apparatus for semiconductor fabrication, and, more particularly, to methods and apparatus for deposition of films on patterned substrates.

2. Discussion of Related Art

For many decades, dry processing techniques, such as physical vapor deposition (PVD) and chemical vapor deposition (CVD), have played a dominant role in integrated circuit (IC) metallization processes. Today, electroplating via wet chemistry methods can be an effective alternative to PVD and CVD methods for some applications. Metallization processes that utilize electroplating, however, still typically require a preliminary PVD step to provide a seed layer, a diffusion barrier and/or an adhesion layer (e.g., a layer of Ti, Ta, TiN, or TaN.)

During microelectronic device fabrication, films are often deposited on non-planar surfaces. The formation of electrical interconnect, for example, can entail the deposition of thin films of metals on patterned substrates. The completed interconnect provides electrical connections between components, such as transistors, in an IC, and between the IC and a package.

The complex interconnections between transistors in modern ICs require the use of several layers of metal wiring that are embedded in interlayer dielectric (ILD) materials. The metal lines at each layer can be formed by filling "trenches" patterned into the ILD. In addition, connections between metal lines of different layers are made by metal-filled holes, i.e., vias. Vias from a first metal layer to a transistor are also referred to as contacts.

The surface topography that wafers exhibit at various steps in a fabrication process arise from patterned features related to, for example, the trenches and/or vias described above. Film deposition through PVD on such wafers can, unfortunately, suffer from shadowing effects. Shadowing effects can cause, for example, poor step coverage on sidewalls and bottoms of trenches and vias, and can cause overhanging structures to form at the top corners of the trenches and vias. These effects can lead to void formation when attempting to fill a surface feature.

Problems related to poor step coverage and void formation are exacerbated as circuit dimensions shrink and aspect ratios of features increase. Due to geometrical shadowing, a film can preferentially deposit near the top corners of a trench or via, and the coverage is poor especially at the bottom corners. Overhangs can cause additional shadowing of sidewalls and bottoms, exacerbating the problem of void formation. The angular distribution of a typical incident flux further complicates control of step coverage.

Directional PVD (DPVD) and ionized PVD (IPVD) techniques can be used to mitigate the step-coverage problems associated with PVD. Common DPVD techniques include long-throw deposition and collimated sputter deposition. Long-throw deposition entails an increased target-to-substrate separation, while collimated sputter deposition uses a collimator cell disposed between a target and a substrate to filter obliquely incident material. Thus, a flux can be made more normal to a wafer by reducing flux divergence, and a greater portion of incident atoms can reach bottoms of features. DPVD, however, typically suffers from poor efficiency, high cost, and can still exhibit poor sidewall coverage and void formation.

In IPVD, atoms approaching a substrate pass through a high-density plasma discharge, and a substantial portion become ionized. A negative bias applied to the substrate attracts the ionized flux of atoms, increasing their directionality and energy in comparison to traditional PVD. When the energies of these ions are set to high enough values, they can re-sputter the overhangs to improve conformality.

Re-sputtered atoms from the bottom of a trench or via can deposit on a nearby sidewall to further improve step coverage. The effectiveness of IPVD, however, is sensitive to atomic ionization rates and to the aspect ratio (AR) values of the patterned surface topography. Excessive re-sputtering often causes the formation of bevels on top corners, and can expose underlying dielectric material. Moreover, re-sputtered material can deposit on the higher parts of sidewalls and thus lead to formation of overhangs and voids.

SUMMARY OF INVENTION

The invention in part arises from the realization that improved film deposition can be obtained by cooperative selection of deposition angle (relative to a substrate normal) and azimuthal orientations for the direction of a vapor flux. In particular, deposition angles can be chosen to provide a more uniform exposure of portions of a feature to the vapor flux. For example, a deposition angle can be chosen so that all portions of a sidewall and a bottom area of a feature, though not simultaneously, are in turn exposed to the flux at least at one of the orientations of the vapor flux. The feature can be, for example, one or more vias and/or one or more trenches.

An oblique angle physical vapor deposition (OAPVD) technique, according to principles of the invention, can provide conformal thin films with enhanced step coverage on patterned surfaces. The enhanced step coverage can reduce the formation of, for example, overhangs and voids. In some embodiments, the invention provides substantially void-free filling of trenches and vias.

Accordingly, in a first aspect, the invention features a method for fabricating an integrated circuit on a substrate having a surface feature associated with a bottom area and a sidewall area. The method includes directing a vapor flux toward the substrate surface from a plurality of directions associated with a plurality of azimuth angles, and selecting a deposition angle of the vapor flux, relative to a normal incidence, that causes at least about half of the bottom area of the feature to be exposed to the vapor flux for substantially all of the plurality of directions. The surface feature can be associated with, for example, one or more vias and/or one or more trenches.

The vapor flux can be directed by, for example, rotating the substrate through the plurality of azimuth angles, providing a plurality of targets associated with the plurality of directions, translating the substrate relative to one or more targets, and/or wobbling the substrate. The vapor flux can be provided by, for example, any technique suitable for semiconductor device fabrication. Suitable techniques include, for example, PVD techniques, such as magnetron sputtering, direct-flux sputtering, radio-frequency sputtering, triode sputtering, post-ionization sputtering, hollow-cathode sputtering, reactive sputtering, and bias sputtering.

In another aspect, the invention features a method for fabricating an integrated circuit. The method includes directing a vapor flux toward a substrate surface from a plurality of directions associated with a plurality of azimuth angles, and selecting a deposition angle of the vapor flux, relative to a normal incidence, that causes an effective thickness balance between a film formed from the vapor flux on a bottom area of a feature and a film formed from the vapor flux on a sidewall area of the feature.

One or more deposition angles may be used to improve conformality of a deposited film. The vapor flux can be directed at the substrate until a substantially conformal film is formed. A second vapor flux can then be directed toward the substrate to substantially fill the feature. The two vapor fluxes can be used to deposit the same or different materials. A different deposition angle can be used for the filling deposition in comparison to the angle used for deposition of the conformal film.

In another aspect, the invention features a method for fabricating an integrated circuit. The method includes directing a vapor flux toward a substrate surface from a plurality of directions associated with a plurality of azimuth angles, and selecting a deposition angle of the vapor flux, relative to a normal incidence, that causes the vapor flux to substantially fill the surface feature with a material associated with the vapor flux.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings:

FIG. 2b is a cross-section view of the embodiment of FIG. 2a.

FIG. 4b is a cross-section view of the deposition system of FIG. 4a;

FIG. 5b is a cross-section view of the deposition system of FIG. 5a;

FIG. 6b is a cross-section view of the deposition system of FIG. 6a;

FIGS. 7b through 7e are cross-section views of the deposition system of FIG. 6a.

DETAILED DESCRIPTION

Figure 1:
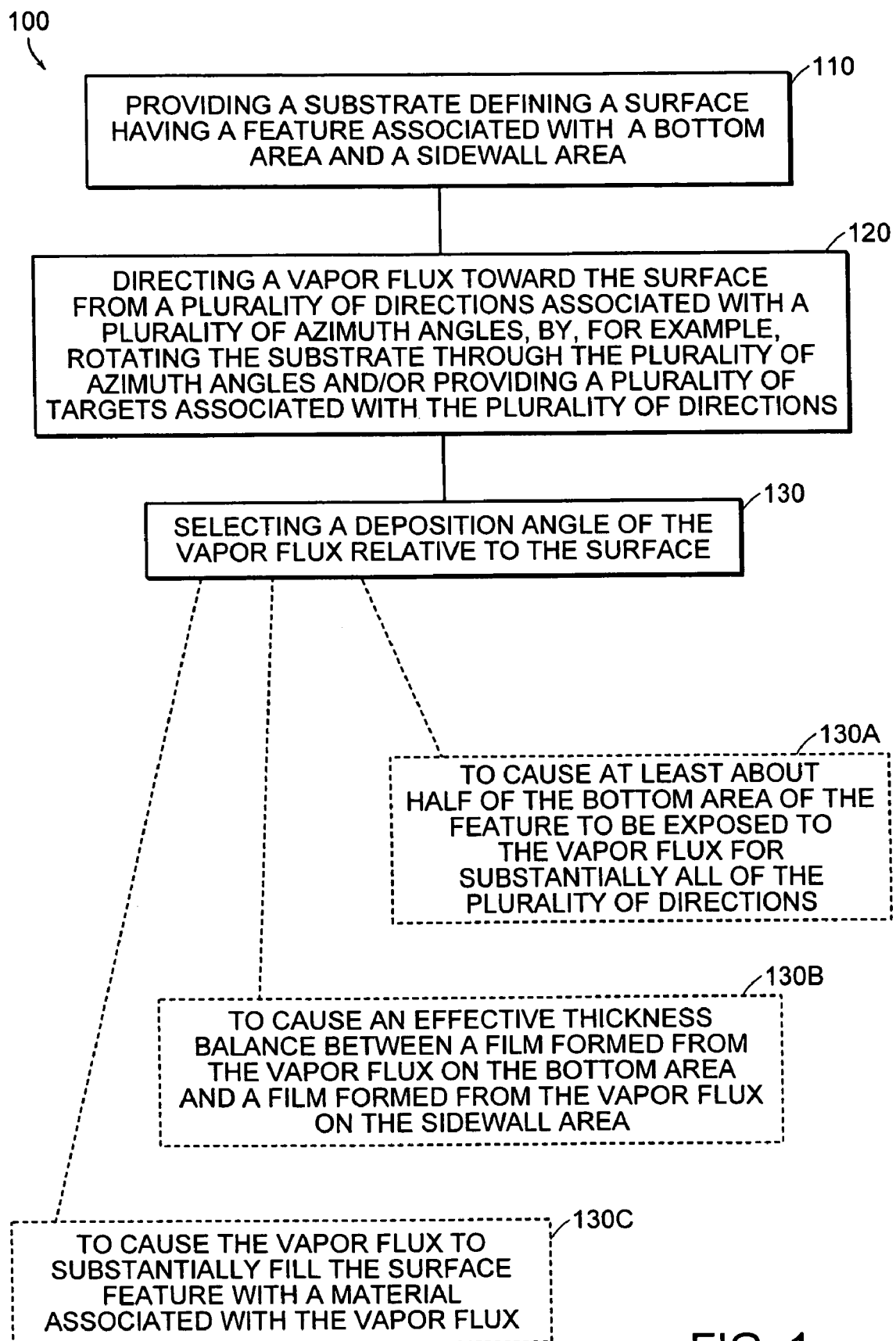
FIG. 1 is a flowchart of an embodiment of a method for fabricating an integrated circuit, according to principles of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

FIG. 1 is a flowchart of an embodiment of a method 100 for fabricating an integrated circuit. The method 100 includes providing a substrate (Step 110), directing a vapor flux toward the surface of the substrate from orientations associated with different azimuthal angles (Step 120), and selecting a deposition angle of the vapor flux relative to a normal direction of the surface (Step 130). The surface of the substrate has a feature that defines a bottom area and a sidewall area. The feature can be, for example, one or more vias and/or one or more trenches. The words "angle" and "orientation" are herein used interchangeably when referring to different azimuthal angles.

The deposition angle can be selected (Step 130), for example, to provide a substantially conformal film and/or to provide filling of the feature with substantially no voids. As described in more detail below, the angle can be selected through empirical or theoretical methods.

The deposition angle is selected (Step 130) via, for example, one or more of three ways. First, the angle can be selected to cause at least about half of the bottom area of the feature to be exposed to the vapor flux for substantially all of the plurality of azimuthal directions (Step 130a). Second, the angle can be selected to cause an effective thickness balance between a film formed from the vapor flux on the bottom area and a film formed from the vapor flux on the sidewall area (Step 130b). Third, the angle can be selected to cause the vapor flux to substantially fill the surface feature with a material associated with the vapor flux (Step 130c). One having ordinary skill in the deposition arts will understand that the selection of an optimal deposition angle will vary with the specific surface feature geometry and process conditions.

Figure 2A:
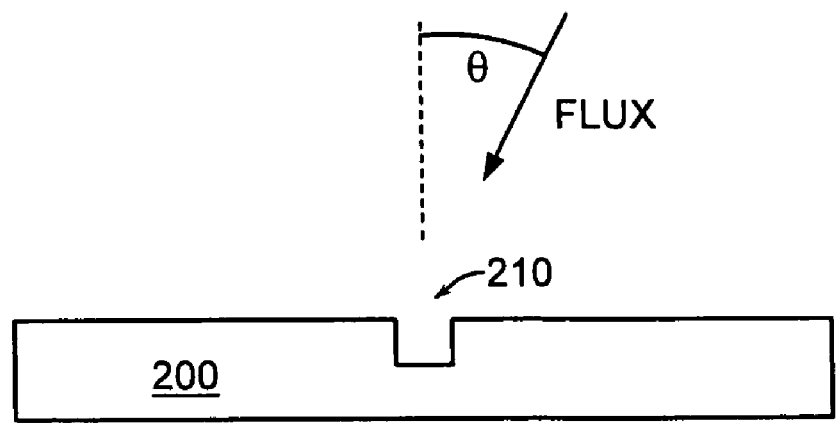
FIG. 2a is a top view of an embodiment of a substrate that is undergoing processing, according to principles of the invention.
Figure 2B:
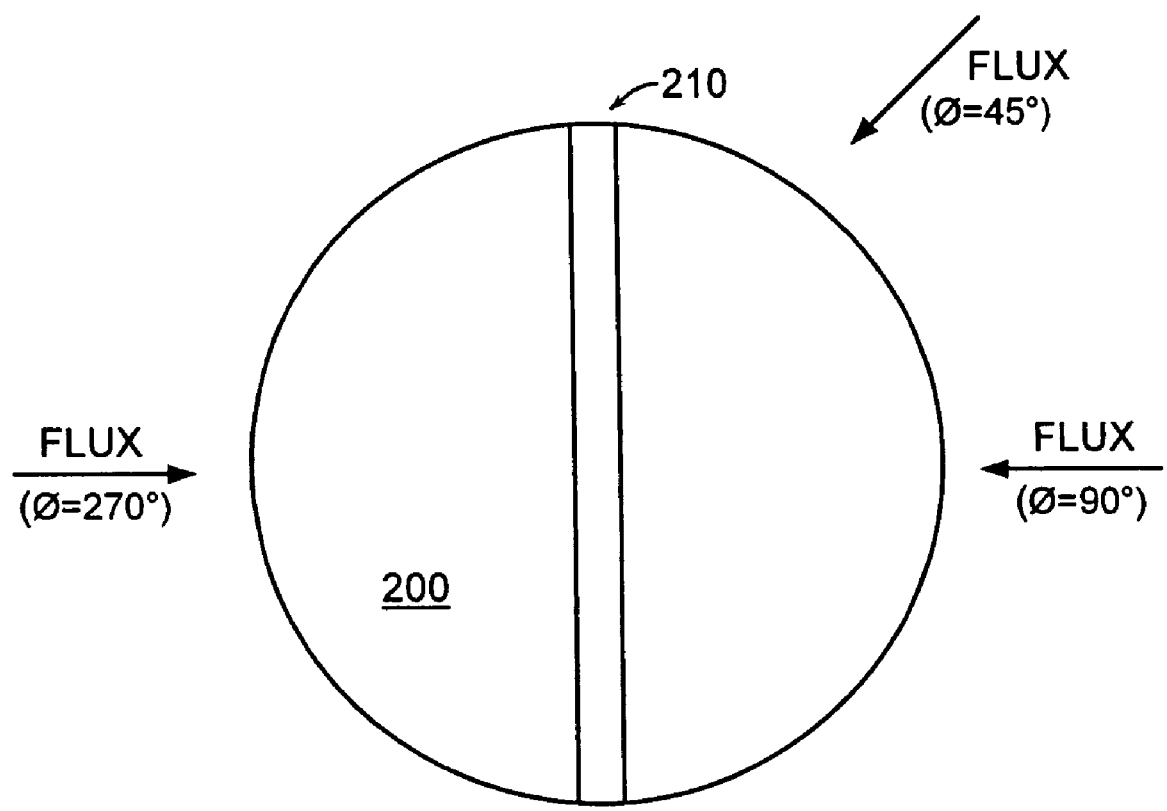

FIG. 2a and FIG. 2b are, respectively, a cross-section view and a top view of an embodiment of a substrate 200 that is undergoing processing according to the method 100. The substrate 200 has a surface feature 210. A vapor flux is directed at the substrate 200 at a deposition angle θ, and from at least two azimuthal angles φ, as illustrated. The azimuthal orientations can be provided, for example, by two or more targets and/or by rotating the substrate.

Referring again to FIG. 1, the vapor flux can be provided, for example, by any deposition technique suitable for semiconductor device fabrication. Suitable techniques include, for example, PVD techniques such as magnetron sputtering, direct-flux sputtering, radio-frequency sputtering, triode sputtering, post-ionization sputtering, hollow-cathode sputtering, reactive sputtering, and bias sputtering. A vapor flux provided by existing techniques typically exhibits some divergence in its direction of travel. In some embodiments of the invention, the vapor flux is ionized and a bias voltage is applied to the substrate to reduce this divergence. In some embodiments, one or more masks are used to reduce the divergence.

Since a flux will typically exhibit some divergence, the direction of the flux is associated with a distribution about a primary direction. Moreover, as described above, the direction of the flux is associated with more than one azimuthal orientation (Step 120). For example, as described in more detail below, the flux can be derived from multiple source targets distributed around the substrate to provide multiple azimuthal angles. Also, for example, a single source target can provide a flux associated with multiple azimuthal angles by rotating the substrate and/or moving the target.

Throughout this specification, deposition angles are identified relative to a direction normal to a substrate surface, as illustrated in FIG. 2*a*. Thus, a vapor flux directed perpendicular to a substrate surface has a deposition angle of zero.

For a feature associated with a height, H, and a width, W, such as a typical via or typical trench, mathematical models expressed in terms of H and W can identify a deposition angle that will cause, for example, at least about half of the bottom area of the feature to be exposed to the vapor flux for substantially all of the azimuthal orientations (Step 130*a*). In some cases, as described below, the deposition angle can be assigned a value of about θ, where θ lies in a range of arctan (W/2H)≦θ≦arctan (W/H) to expose at least some of the bottom area to the flux for at least some of the orientations.

Alternatively, the deposition angle can be selected from empirical observations that indicate an angle that provides, for example, a balance of thickness between the film formed on the bottom area and the film formed on the sidewall area (Step 130*b*). A selection of a desirable angle to provide a film thickness balance can also be supported by modeling, for example, by Monte Carlo-based simulations. Similar approaches can provide selection of a deposition angle that will support substantial filling of the feature (Step 130*c*).

In some situations, the film thickness grows much faster on portions of the wafer surface adjacent to the feature (the "field") than on the bottom of the feature, for example, during high pressure deposition on high aspect ratio features. In these situations, the effective aspect ratio of a feature can increase during deposition due to the effective increase in height of the sidewall. The shadowing effect on the bottom area of the feature can thus be enhanced during deposition. The film may reach a critical thickness at which the film conformality is lost. This problem can be mitigated by changing the deposition angle at least once during a deposition process. For example, when a critical field thickness is reached, the deposition angle can be reduced so that the bottom of, for example, a trench or via is exposed to the flux and the growth rate on the bottom of the feature is increased.

The method 100 can be used to deposit one or more materials. For example, a conformal film of a first material can be deposited, followed by deposition of a second material that substantially fills remaining space of the feature. The deposition angle can be separately selected for each material. The first and second materials can be the same or different materials. For example, a first film can be formed of TiN, and a second film can be formed of Al. The TiN can act as, for example, a diffusion barrier for the Al.

In some processes, according to principles of the invention, the method 100 is used to deposit a conductive, protective, and/or seed layer, and a feature is subsequently filled through use of a technique other than PVD. For example, the method 100 can be used to deposit Ta and/or TaN, and Cu can then be deposited via electroplating from a solution. The film deposited though use of the method 100 can provide one or more layers that provide a barrier layer, a seed layer, and/or an electrically conducting layer for the subsequently deposited Cu.

For a material that does not require, for example, a seed or barrier layer, the method 100 can be used to fill a feature in a single process, perhaps with only an adjustment of the deposition angle during the process.

The method 100 can provide the same flux level from all azimuthal orientations or can provide a different flux at different orientations. For example, the flux can be varied in response to the geometry of features being filled on a substrate. For example, the flux level may be increased for orientations perpendicular to the length of a trench relative to the flux level for directions parallel, or near parallel, to the length of the flux. Thus, according to principles of the invention, the flux levels can be adjusted to adjust the balance of the thickness of a film deposited on a bottom area versus the thickness of the film deposited on a sidewall area.

Figure 3A:
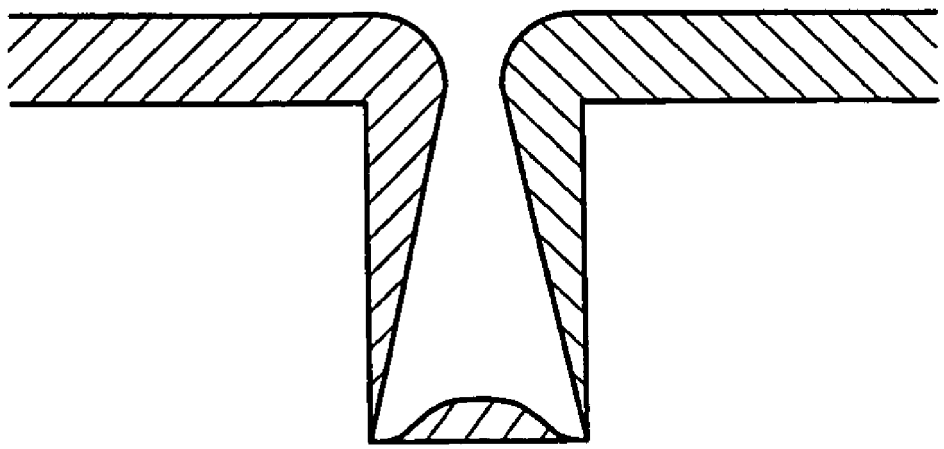
FIG. 3a is a top view of a prior art via during processing.
Figure 3B:
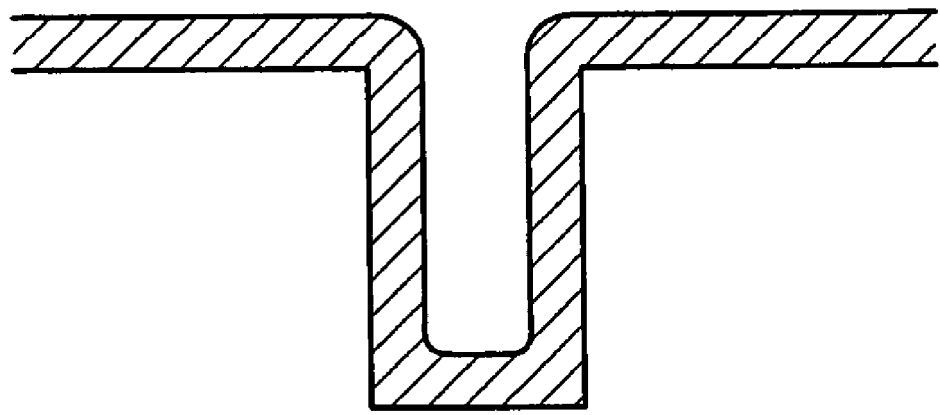
FIG. 3b is a cross-sectional view of an embodiment of a via during processing, according to principles of the invention.

FIG. 3*a* is a cross-section view of a via shown at an intermediate stage of a prior art process, and FIG. 3*b* is a cross-section view of an embodiment of a via at a stage of a process according to principles of the invention. As illustrated in the prior art process example of FIG. 3*a*, the deposited film has an non-uniform thickness along the via bottom, and along the via sidewall, as well as a thickness difference between the sidewall and the bottom. Further, the upper corners of the via have developed an overhang of deposited material, while the bottom corners illustrate an early stage in the formation of voids. As illustrated by the example of FIG. 3*b*, the via has a uniform film thickness along the bottom and sidewall, with good coverage in the bottom corners.

Figure 5A:
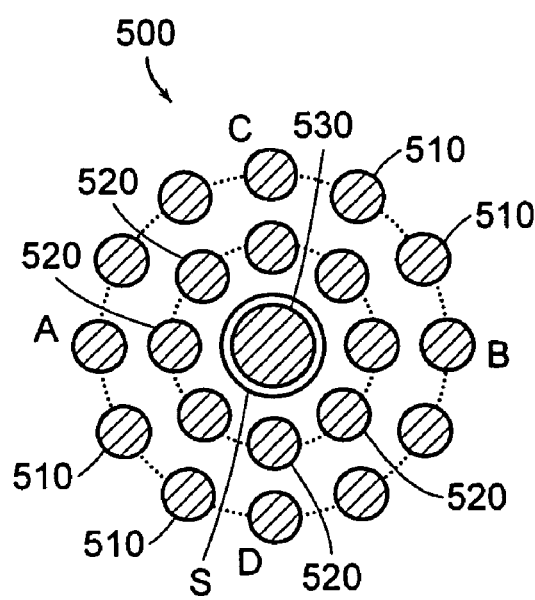
FIG. 5a is a top view of an embodiment of a deposition system, according to principles of the invention.
Figure 5B:
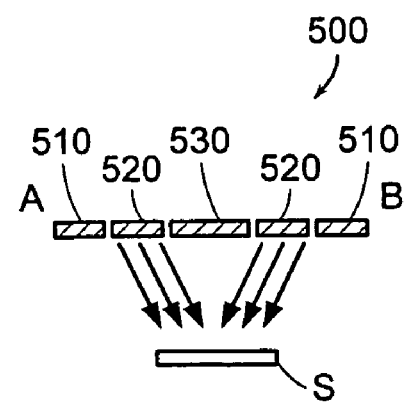
Figure 6A:
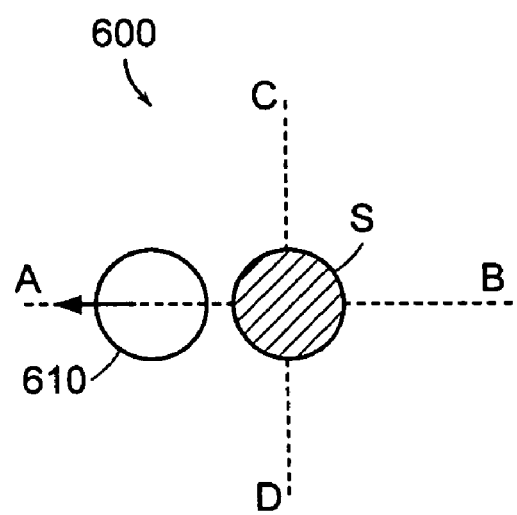
FIG. 6a is a top view of an embodiment of a deposition system, according to principles of the invention.
Figure 6B:
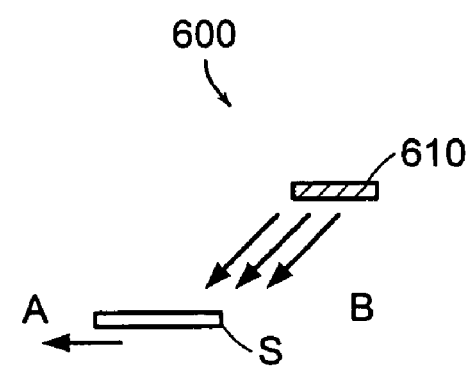

Now referring to FIGS. 4 through 6, directing the flux from different azimuthal directions (Step 120) can be accomplished in various ways, for example, by movement of the substrate, movement of the target, and/or provision of multiple targets.

Figure 4A:
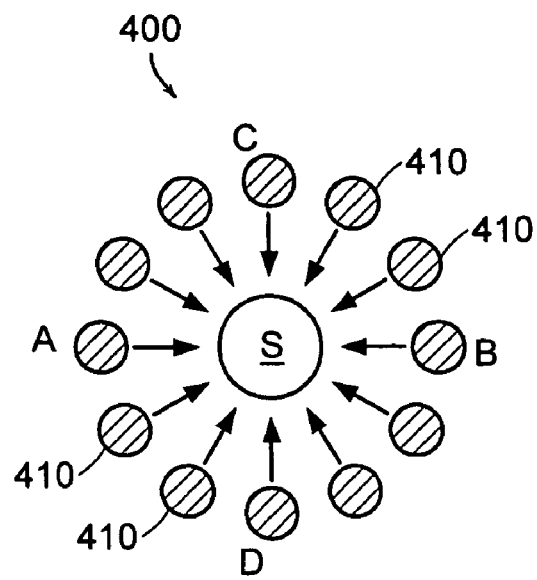
FIG. 4a is a top view of an embodiment of a deposition system, according to principles of the invention.
Figure 4B:
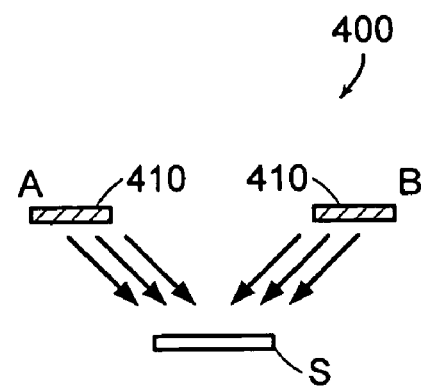

FIG. 4*a* is a top view and FIG. 4*b* is a cross-sectional view of an embodiment of a deposition system 400 according to principles of the invention. The deposition system 400 includes targets 410 that define a ring around a substrate S (four of the targets reside at positions A, B, C, and D.) A vapor flux can be provided from two or more azimuthal orientations by forming vapor, for example, via sputtering, from two or more of the targets (for example, the two target at positions A and B.) The vapor flux can be formed, for example, sequentially or simultaneously from the two or more targets.

As illustrated in FIG. 4*b*, the targets 410 at positions A and B can provide two opposed azimuthal orientations for the vapor flux. In alternative embodiments of the system 400, one or more of the targets 410 can be tilted relative to the substrate to modify the vapor flux directed from the tilted target 410 toward the substrate S. Tilting a target 410 can, for example, increase a current of the flux directed toward the substrate S.

FIG. 5*a* is a top view and FIG. 5*b* is a cross-section view of an embodiment of another deposition system 500, according to principles of the invention. The deposition system 500 includes several targets 510 that define a first ring around a substrate S, targets 520 that define a second ring of a different radius around the substrate S, and a centrally located target 530. A vapor flux can be provided from two or more of the targets 510, 520, 530, for example, from targets 510, 520, 530 residing by positions A, B, C, and/or D. The vapor flux can be formed, for example, sequentially or simultaneously from the two or more targets 510, 520, 530.

The targets 510, 520, 530 can be formed of different materials, for example the targets 510 of the first ring can provide a flux of a first material while the targets 520 of the second ring can provide a flux of a second material. In one embodiment of the invention, a first conformal film is deposited, for example, using the targets 510, followed by filling of remaining space in features with a film using the targets 520. As described above, the targets 510, 520, 530 can be tilted to modify the flux directed toward the substrate.

In some embodiments of the invention, flux direction is controlled, at least in part, by translation of a target and/or translation of a substrate. For example, FIG. 6a is a top view of a deposition system 600, according to principles of the invention, that includes a target 610 from which a flux is directed toward a substrate S. The substrate S is translatable between positions A, B, C, and D. Thus, the target 610 can provide a flux from four different azimuthal orientations by translating the substrate S to the four positions A, B, C, and D. In this embodiment, the deposition angle can also be altered by translation of the substrate S closer to, or further from, the position immediately adjacent to the target 610.

In some embodiments of the method 100, the vapor flux is directed from different azimuthal angles (Step 120) by rotating the substrate through the plurality of azimuth angles. The substrate can be rotated, for example, continuously or discontinuously to provide a vapor flux from a discreet set of orientations, or to provide the flux through a range of orientations. In some embodiments, the substrate is rotated at a constant rate; in other embodiments the substrate is rotated at a variable rate. Thus, the portion of a deposition associated with a particular azimuthal orientation can be controlled, for example, by controlling the location of a target, the rotation of a substrate, the tilt of a target, and/or the power delivered to the target.

In some embodiments, according to principles of the invention, a deposition system is configured to provide a vapor flux that is substantially uniform across a face of the substrate. Such a system can have, for example, a sputter target having an area similar to or greater than the surface area of the substrate.

In some embodiments, a system is configured to sputter an area of a target that is less than an area of the substrate, and to provide the vapor flux with a divergence sufficient to direct the vapor flux toward substantially all of the surface of the substrate. Some systems, according to principles of the invention, are configured to block a portion of the vapor flux to reduce a divergence of the vapor flux. Some systems are configured to ionize at least a portion of the vapor flux, and electrically bias the substrate to reduce a divergence of the vapor flux.

Now referring to FIGS. 7a through 7e, in some embodiments of the invention, flux azimuthal orientation is controlled, at least in part, by wobbling of the substrate. Wobbling, as defined herein, in the case of a substrate, relates to a rotation of the substrate about one or more axes lying substantially parallel to a surface of the substrate. In some of these embodiments, a wobble is implemented as a rolling-type action, e.g., as a rolled coin wobbles completely about its circumference before coming to a complete rest on a surface. A wobble of a substrate, according to principles of the invention, can entail wobbling the substrate to one or more discreet azimuthal orientations, or wobbling continuously through a range of azimuthal orientations (similar to the coin metaphor.)

Figure 7A:
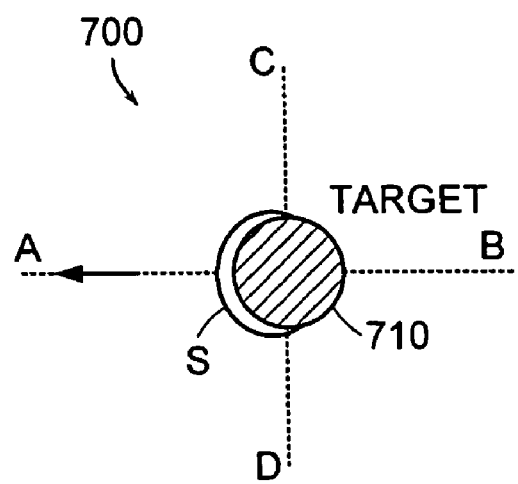
FIG. 7a is a top view of an embodiment of a deposition system, according to principles of the invention.
Figure 7B:
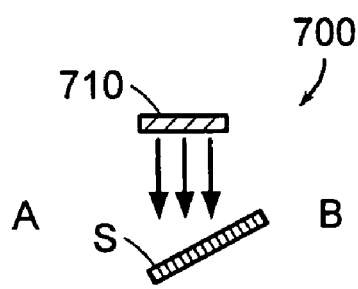
Figure 7C:
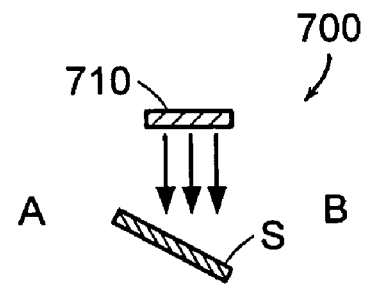
Figure 7D:
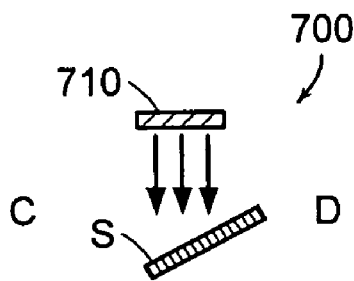
Figure 7E:
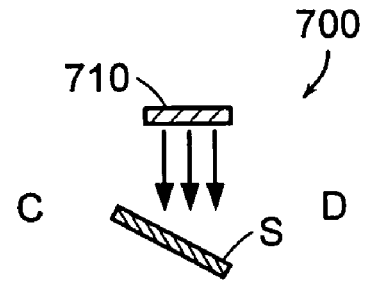

For example, FIG. 7a is a top view of a deposition system 700, and FIGS. 7b, 7c, 7d, and 7e. are cross-section views of the system 700, according to principles of the invention.

The system 700 includes a target 710 from which a flux is directed toward a substrate S. The substrate S can be wobbled to tilt the substrate surface toward the positions A, B, C, and D, as illustrated, respectively, in FIGS. 7b, 7c, 7d, and 7e. Thus, the target 710 can provide a flux from four different azimuthal orientations by wobbling the substrate S in turn toward the four positions A, B, C, and D.

The substrate S can also be wobbled to select a deposition angle for a particular azimuthal orientation by varying the amount of tilt of the substrate toward that orientation. Moreover, for deposition of one or more films, a wobble-type rotation can be varied in a step-wise fashion and/or in a continuous rotation. Thus, the substrate S can be wobbled to obtain two or more azimuthal orientations, and to obtain one or more deposition angles to produce one or more conformal films and/or fill a surface feature.

Some embodiments similar to system 700 include more that four targets to provide additional azimuthal orientations. One of these embodiments includes sufficient targets defining a ring to provide the option of a substantially continuous range of orientations. By wobbling the substrate, this embodiment may provide a deposition similar to that obtainable by, for example, continuous rotation of a substrate with a flux provided by one target. For example, as a substrate is wobbled through 360° of azimuthal orientations in turn toward each target, a flux can be provided in turn from each target to provide a deposition with an effectively continuous range of orientations and an effectively fixed deposition angle.

As described next, sample films were fabricated according to some principles of the invention. The samples described below merely illustrate some features of the invention, and should be not be viewed as indicative of limits with respect to choice of materials, surface feature geometries, or process conditions.

Films were deposited on a sample substrates having parallel trenches with a height of 400 nm and a width of 200 nm, i.e., an aspect ratio (AR) of 2:1. The trenches had a separation of 200 nm. Films were deposited in a DC-magnetron sputtering system at a power of 200 Watts and an Ar pressure of about 2.0 mTorr. The maximum substrate temperature during the depositions was about 85° C.

Ruthenium (Ru) films were deposited on the sample substrates. The depositions were performed from a 99.95% pure Ru cathode of diameter 7.6 cm. Substrates were mounted on a sample holder located at a distance of about 15 cm from the cathode.

Each substrate was rotated at a speed of 6 or 30 rpm, and was tilted to control the deposition angle θ (normal incidence being 0°) The deposition rates were about 17 nm/min at a normal incidence, about 16 nm/min at θ=15°, and about 15 nm/min at θ=30°. The thickness and step coverage of the films was evaluated via scanning electron microscopy (SEM) of cross sections of the samples.

Films deposited at θ=15° and at θ=30°, with at field thicknesses, $d_f$ of about 115 nm exhibited no crack-like voids at the bottom corners of the trenches, unlike films deposited at a normal incidence. Further, for normal incidence, the film thickness at the bottom of the trench was not uniform, with a rounded thickness distribution, similar to that illustrated in FIG. 3a.

The conformality of a film may be quantified through use of, for example, the following ratio:

$$R_{b/sw} = \frac{F_b}{F_{sw}} = \frac{d_b}{d_{sw}},$$

where $F_{sw}$ is the deposition rate on a sidewall area, $F_b$ is the deposition rate on the bottom area, $d_b$ is the bottom thickness of the film (as measured at the center,) and $d_{sw}$ is the sidewall film thickness. A perfectly conformal film would have $R_{b/sw}=1$. For the $\theta=0°$ sample (field thickness $d_f$ of about 255 nm), $R_{b/sw}$ was about 3.9. At a similar field thickness, the $\theta=15°$ sample had $R_{b/sw}$ of about 1.7. For the $\theta=30°$ sample, at a field thickness $d_f$ of about 113 nm, $R_{b/sw}$ was about 1.2. Thus, for example, empirical determinations can be used to select a preferred deposition angle.

Alternatively, or in conjunction with empirical studies, various models can be developed to support selection of the deposition angle. For a circular via, for example, a relatively simple model can be developed because the geometrical state of the via does not vary for different azimuthal directions. At angles close to normal incidence, the bottom center of the via will typically grow relatively quickly, developing a rounded non-conformal coverage. When the deposition angle is too large, the bottom of the via can be completely shadowed, and a film on an upper sidewall can grow relatively quickly and form undesired overhangs.

In view of these considerations, a range of desirable deposition angles can be expressed as, for example:

$$\theta_{min} \leq \theta \leq \theta_{max} \Rightarrow \arctan\left(\frac{1}{2 \times AR}\right) \leq \theta \leq \arctan\left(\frac{1}{AR}\right),$$

where AR is the aspect ratio. For example, for an AR of 2:1, $\theta_{min}$ is about 14° and $\theta_{max}$ is about 27°.

If $\theta_{min}$ is chosen as the deposition angle for all azimuthal directions, all portions of the via bottom will have a line-of-sight of the incident flux at least some of the directions. Thus, as the substrate is rotated, for example, no bottom surface points remain entirely in shadow.

If the deposition angle is chosen to be about $\theta_{max}$ or greater, then the sidewalls of the via can be exposed to the flux while the via bottoms substantially remain shadowed. At these deposition angles, $F_b$ can be about 0. The variation of deposition rate with deposition angle is exploited in some embodiments of the invention. For example, a generally slow deposition rate on a sidewall area can be compensated by varying the deposition angle to increase the amount of deposition on the sidewall area relative to the bottom area.

Assuming, for example, that $F_{sw}<F_b$ for $\theta=\theta_{min}$, the deposition angle, $\theta$, can be changed from, for example, $\theta_{max}$ to $\theta_{min}$ in during deposition, by discreet and/or continuous steps, to adjust the conformality of a deposition to obtain $R_{b/sw}=1$. Moreover, a first deposition angle can be used for deposition of a substantially conformal film, and a second deposition angle can be used to substantially fill a remaining space in a via.

Modeling a desirable deposition angle for a square via can be more complex than for the circular via due to the four-fold symmetry of the square via. If the angle is chosen to be $\theta_{max}$, as defined in the above equation, a similar result as for circular vias may be obtained, i.e., $F_b$ may be about zero.

For $\theta=\theta_{min}$, as defined above, with rotation, a point on the bottom area of the square via may receive about twice the incident flux in comparison to a sidewall point. In this example, one can approximate $F_b$ as about equal to $2 \times F_{sw}$, and that therefore $R_{b/sw} \approx 2$. It may therefore be helpful to choose a deposition angle between $\theta_{min}$ and $\theta_{max}$ to obtain $R_{b/sw} \approx 1$ for a square via.

For trench structures, analysis of the deposition process can be more complex than for the case of vias. When the flux is directed toward one of the sidewalls of a trench, and at a deposition angle of $\theta_{max}$, as defined above, all points on the trench bottom area may be shadowed. As the trench is rotated relative to the azimuthal orientation of the flux, there may be no shadowing of the trench bottom when the flux becomes parallel to the length of the trench. Thus, on average, the deposit on the bottom of the trench may growth at, for example, almost half of the growth rate of the field deposit, i.e., the deposit on the surface area outside of the trench.

As one example, a deposition rate on a trench sidewall can be modeled as being about one fourth the field deposition rate, plus a correction factor, i.e.:

$$F_{sw} \approx \frac{F_f}{4} + \varepsilon$$

The correction factor, $\varepsilon$, may be relatively small, and may be measured empirically for a particular set of deposition parameters. The conformality of a film deposited on the trench may then be modeled as, for example:

$$R_{b/sw} \approx \frac{2}{\left(1 + \frac{4\varepsilon}{F_f}\right)} \text{ (for } \theta = \theta_{max}.)$$

This illustrative model suggests that a deposition where $\varepsilon \approx F_f/4$ may provide substantially conformal growth, i.e., $R_{b/sw} \approx 1$. For this model, $\varepsilon$ may have a value in a range of 0 to $3F_f/4$. This range of $\varepsilon$ gives the following range of conformality factors:

$$1/2 \leq R_{b/sw} \leq 2 \text{ (for } \theta=\theta_{max}.)$$

For the above-described sample, having a trench with a sidewall height of 400 nm and a width of 200 nm, the modeled value of $\theta_{max}$ is about 27°, while the empirically measured value is about 30°.

For a deposition angle of $\theta_{min}$, as defined above, about half of the bottom area of the trench has line-of-sight of the flux during about one quarter of a substrate rotation (when the sidewall approximately faces the incident flux). During this portion of a rotation, the deposition rate for the expose bottom area may be assumed to be, for example, similar to the deposition rate for the sidewall facing the flux, i.e., $F_b$ about equal to $F_{sw}$. Thus, in comparison to the $\theta=\theta_{max}$ case, the bottom deposition rate is increased in this model as follows:

$$F_b \approx \frac{F_f}{2} + F_{sw},$$

and the conformality factor (for bottom to field ) can be estimated as:

$$R_{b/f} \approx 3/4 + \varepsilon/F_f \text{ (for } \theta=\theta_{min}.)$$

This illustrative model predicts a thicker bottom area film thickness for $\theta=\theta_{min}$ compared to that obtained for $\theta=\theta_{max}$. The conformality of the bottom relative to the sidewall can be expressed as:

$$R_{b/sw} \approx 1 + \frac{1}{\left(\frac{1}{2} + \frac{2\varepsilon}{F_f}\right)} \text{ (for } \theta = \theta_{min.}\text{)}$$

with a range of values of:

$$3/2 \leq R_{b/sw} \leq 3 \text{ (for } \theta=\theta_{min.}\text{)}$$

This illustrative model suggests that it may not be possible to obtain $R_{b/sw}=1$ by depositing at a single deposition angle of $\theta_{min}$. In this case, for example, the deposition angle can be varied between $\theta_{max}$ and $\theta_{min}$ to obtain an effective value of $R_{b/sw}$ equal to about 1.

Having thus described several aspects of at least one embodiment of this invention, it is to be appreciated various alterations, modifications, and improvements will readily occur to those skilled in the art. For example, although the embodiments described above focus on vias and trenches for illustrative purposes, principles of the invention may be applied to features having, for example, sidewalls of varying heights, bottom areas of varying widths, and non-right angles between sidewall areas and bottom areas. Such alterations, modifications, and improvements are intended to be part of this disclosure, and are intended to be within the spirit and scope of the invention. Accordingly, the foregoing description and drawings are by way of example only.

The invention claimed is:

1. A method for fabricating an integrated circuit, comprising:
   providing a substrate defining a surface having a feature associated with a bottom area and a sidewall area;
   directing a vapor flux toward the surface from a plurality of directions associated with a plurality of azimuth angles; and
   selecting a deposition angle of the vapor flux relative to the surface that causes at least about half of the bottom area of the feature to be exposed to the vapor flux for substantially all of the plurality of directions;
   wherein directing comprises wobbling the substrate through the plurality of azimuth angles.

2. The method of claim 1, wherein selecting comprises selecting the deposition angle in response to an aspect ratio of the surface feature.

3. The method of claim 1, wherein the surface feature is associated with at least one feature selected from the group consisting of a via and a trench.

4. The method of claim 1, wherein directing comprises directing the vapor flux toward the substrate at least until the surface feature is substantially filled by a material associated with the vapor flux.

5. The method of claim 1, wherein directing comprises causing a direction of the vapor flux to be substantially uniform across a face of the substrate.

6. The method of claim 5, wherein directing comprises forming the vapor flux by a deposition technique selected from a group of techniques consisting of: magnetron sputtering, direct-flux sputtering, radio-frequency sputtering, triode sputtering, post-ionization sputtering, hollow-cathode sputtering, reactive sputtering, bias sputtering, and physical vapor deposition.

7. The method of claim 6, wherein directing comprises forming the vapor flux by ionized physical vapor deposition.

8. The method of claim 5, wherein directing comprises forming the vapor flux by sputtering an area of a target that is at least about the same as an area of the substrate.

9. The method of claim 5, wherein directing comprises forming the vapor flux by sputtering an area of a target that is less than an area of the substrate, and causing the vapor flux to have a divergence sufficient to direct the vapor flux at substantially all of a surface of the substrate.

10. A method for fabricating an integrated circuit, comprising:
    providing a substrate defining a surface having a feature associated with a bottom area and a sidewall area;
    directing a vapor flux toward the surface from a plurality of directions associated with a plurality of azimuth angles; and
    selecting a deposition angle of the vapor flux relative to the surface that causes at least about half of the bottom area of the feature to be exposed to the vapor flux for substantially all of the plurality of directions;
    wherein directing comprises rotating the substrate through the plurality of azimuth angles.

11. A method for fabricating an integrated circuit, comprising:
    providing a substrate defining a surface having a feature associated with a bottom area and a sidewall area;
    directing a vapor flux toward the surface from a plurality of directions associated with a plurality of azimuth angles; and
    selecting a deposition angle of the vapor flux relative to the surface that causes at least about half of the bottom area of the feature to be exposed to the vapor flux for substantially all of the plurality of directions;
    wherein directing comprises providing a plurality of targets associated with the plurality of directions.

12. The method of claim 11, wherein the plurality of targets define at least one ring.

13. The method of claim 11, wherein directing comprises sequentially or simultaneously directing the vapor flux from the plurality of directions.

14. A method for fabricating an integrated circuit, comprising:
    providing a substrate defining a surface having a feature associated with a bottom area and a sidewall area;
    directing a vapor flux toward the surface from a plurality of directions associated with a plurality of azimuth angles; and
    selecting a deposition angle of the vapor flux relative to the surface that causes at least about half of the bottom area of the feature to be exposed to the vapor flux for substantially all of the plurality of directions;
    wherein selecting comprises selecting the deposition angle in response to an aspect ratio of the surface feature; and
    wherein the feature is associated with a height, H, and a width, W, and the selected angle has a value of about $\theta$, where $\theta$ is in a range of arctan $(W/2H) \leq \theta \leq$ arctan $(W/H)$.

15. A method for fabricating an integrated circuit, comprising:
    providing a substrate defining a surface having a feature associated with a bottom area and a sidewall area;
    directing a vapor flux toward the surface from a plurality of directions associated with a plurality of azimuth angles;

selecting a deposition angle of the vapor flux relative to the surface that causes at least about half of the bottom area of the feature to be exposed to the vapor flux for substantially all of the plurality of directions; and reducing a divergence of the vapor flux.

16. A method for fabricating an integrated circuit, comprising:

providing a substrate defining a surface having a feature associated with a bottom area and a sidewall area;

directing a vapor flux toward the surface from a plurality of directions associated with a plurality of azimuth angles; and selecting a deposition angle of the vapor flux relative to the surface that causes an effective thickness balance between a film formed from the vapor flux on the bottom area and a film formed from the vapor flux on the sidewall area;

wherein directing comprises wobbling the substrate through the plurality of azimuth angles.

17. The method of claim 16, wherein directing comprises directing the vapor flux until a substantially conformal film of a first material associated with the vapor flux forms on the areas of the feature, and further comprising, after forming the film, substantially filling the feature with a second material by a process selected from directing a second vapor flux toward the substrate, and depositing a second material from a solution.

18. The method of claim 17, further comprising changing the selected deposition angle after forming the conformal film, wherein the first and second materials are the same material.

19. A method for fabricating an integrated circuit, comprising:

providing a substrate defining a surface having a feature associated with a bottom area and a sidewall area;

directing a vapor flux toward the surface from a plurality of directions associated with a plurality of azimuth angles; and selecting a deposition angle of the vapor flux relative to the surface that causes the vapor flux to substantially fill the surface feature with a material associated with the vapor flux;

wherein directing comprises wobbling the substrate through the plurality of azimuth angles.

20. The method of claim 19, wherein the substantially filled surface feature is substantially free of voids.

21. The method of claim 19, wherein the feature is associated with a height, H, and a width, W, and the selected angle has a value of about $\theta$, where $\theta$ is in a range of $0 < \theta \leq \arctan(W/H)$.

* * * * *